United States Patent [19]

Frost

[11] 4,127,823

[45] Nov. 28, 1978

[54] PROGRAMMABLE CONTROLLER

[76] Inventor: R. Jack Frost, 4961-C Westmoreland Ct., Dayton, Ohio 45431

[21] Appl. No.: 771,595

[22] Filed: Feb. 23, 1977

[51] Int. Cl.² ............................................. G01R 11/16
[52] U.S. Cl. ..................................... 328/130; 328/75; 328/48
[58] Field of Search ................... 328/129, 130, 37, 75, 328/61, 48

[56] References Cited

U.S. PATENT DOCUMENTS

| | | | |
|---|---|---|---|
| 2,975,338 | 3/1961 | Bivens et al. | 328/130 X |
| 3,657,658 | 4/1972 | Kubo | 328/37 X |
| 3,697,879 | 10/1972 | Holliday | 328/61 |
| 3,829,784 | 8/1974 | Eshraghian | 328/130 |

Primary Examiner—John S. Heyman
Attorney, Agent, or Firm—Joseph E. Rusz; Robert Kern Duncan

[57] ABSTRACT

A single digitally programmable divide by "N" counter controls a timing sequence composed of a plurality of timed intervals. Each interval in the sequence is independent of the other intervals even though the same programmable divide by N counter is used to control the length of each interval. The completely digital controller automatically reprograms itself in a predetermined manner for each interval in a sequence. A single clock circuit provides the interval lengths typically ranging from milliseconds to hundreds of hours for the controlled intervals. The output from the controller is a repetitive series of "1"s and "0"s of the adjustable timed durations.

2 Claims, 7 Drawing Figures

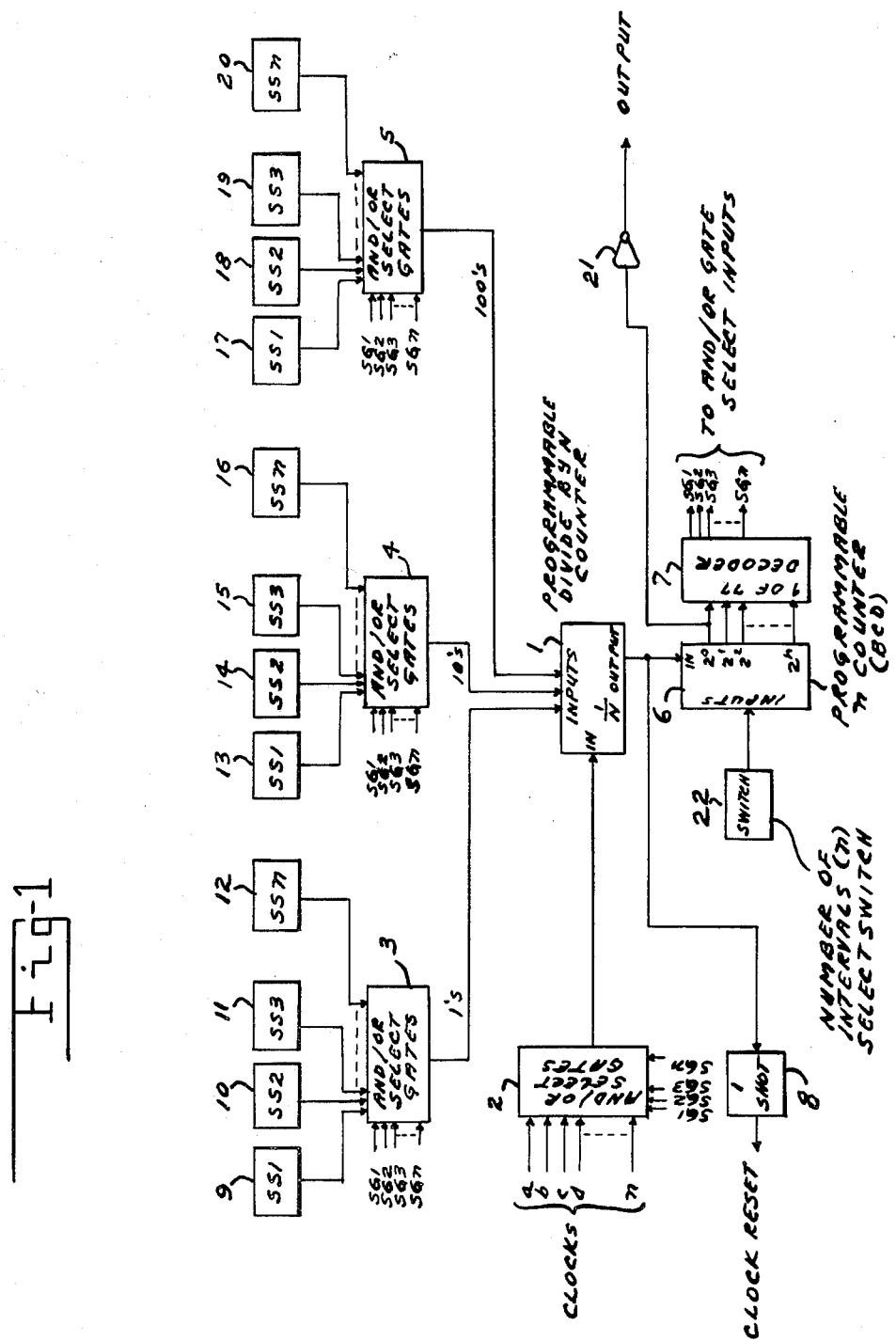

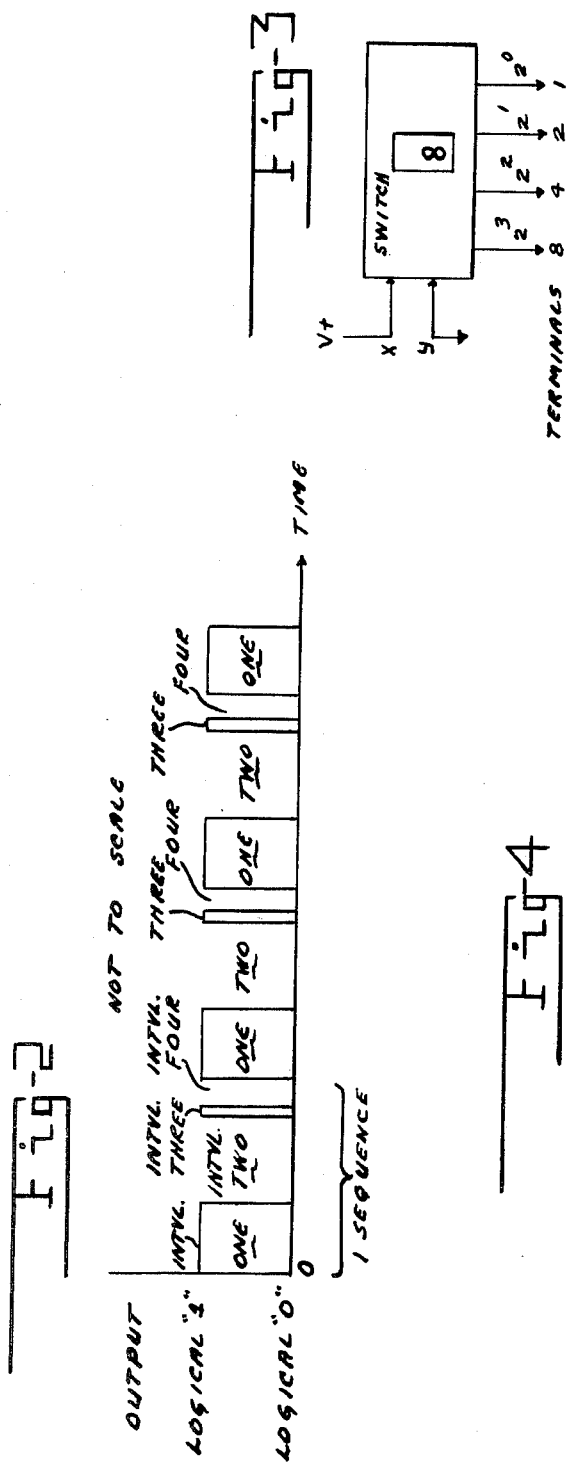
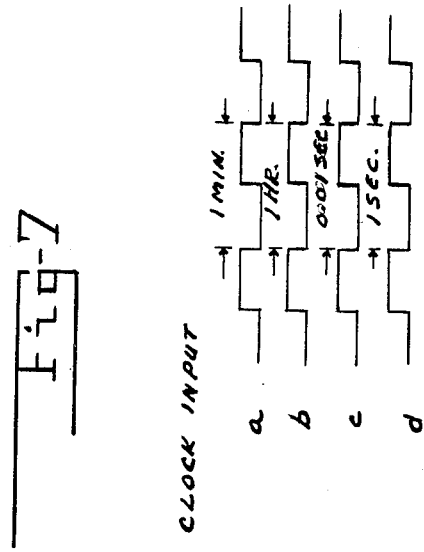

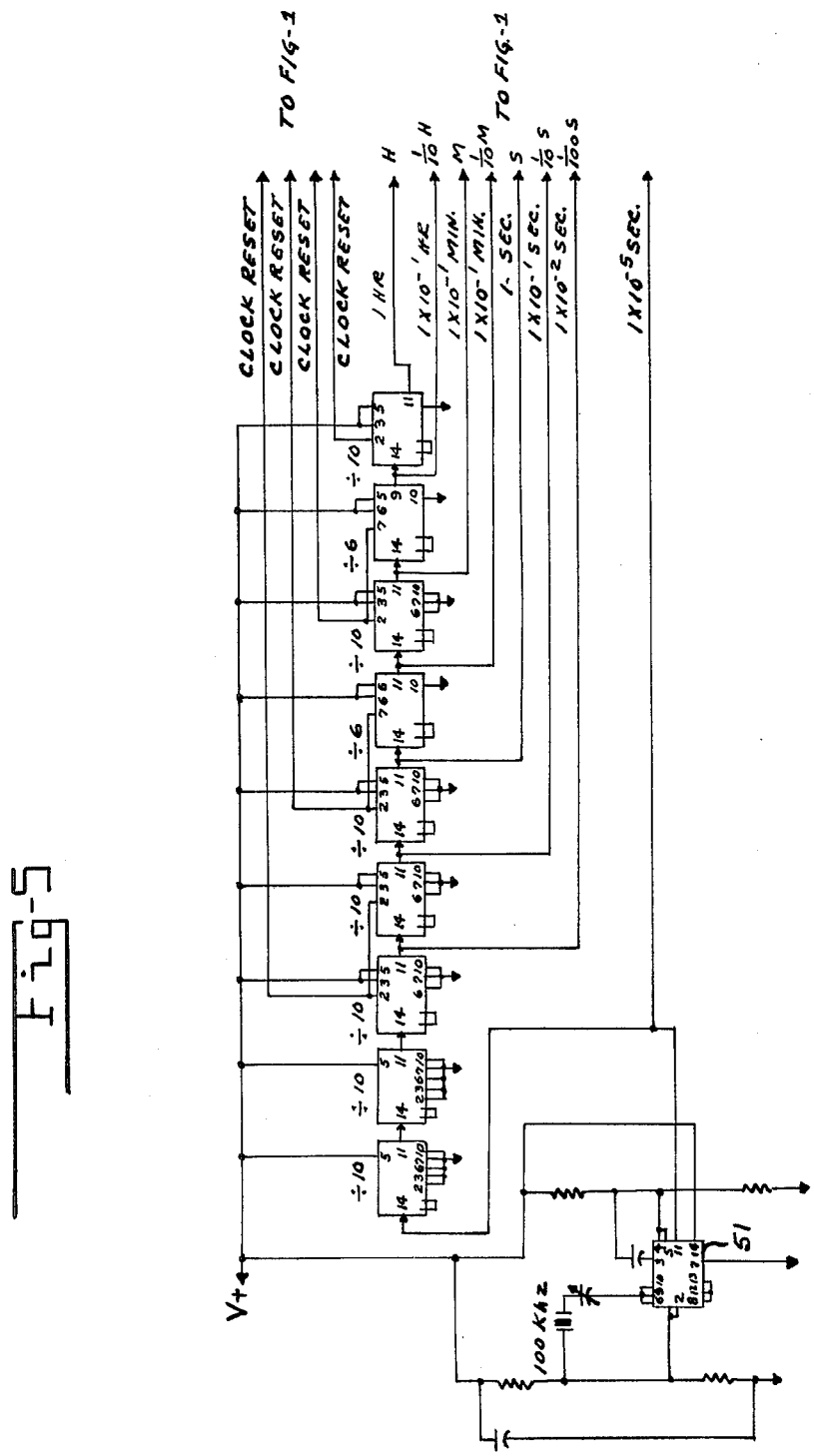

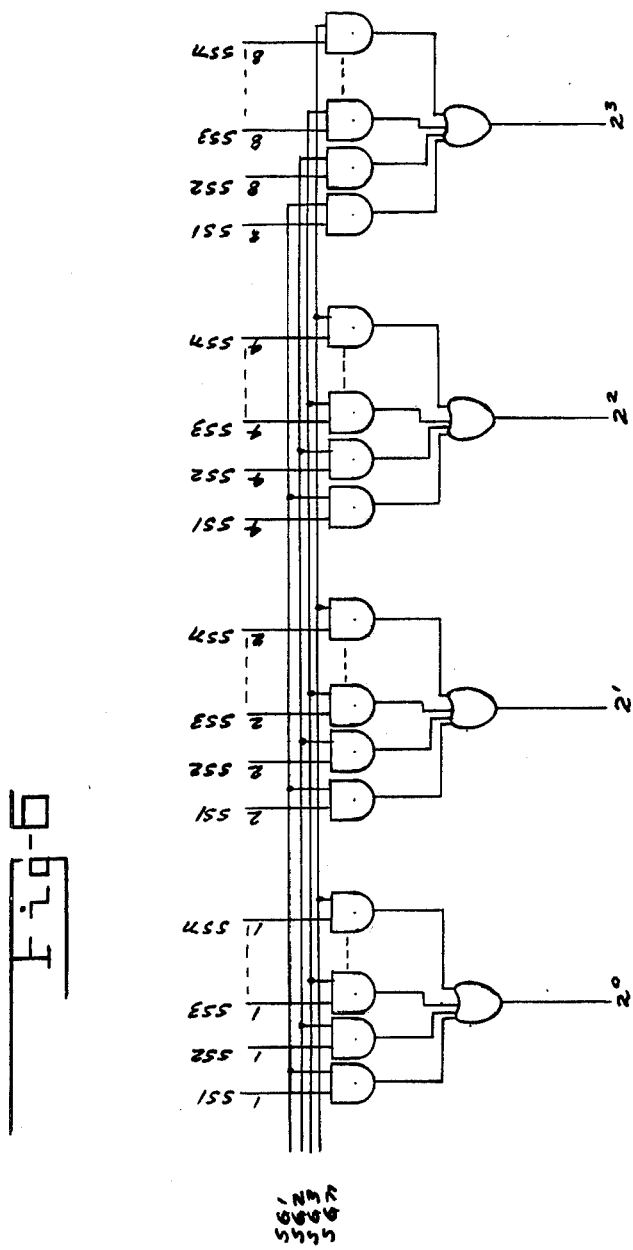

PROGRAMMABLE CONTROLLER

RIGHTS OF THE GOVERNMENT

The invention described herein may be manufactured and used by or for the Government of the United States for all governmental purposes without the payment of any royalty.

BACKGROUND OF THE INVENTION

The field of the invention is in the art of repetitive sequence digital electronic timers.

Sequential timers of varying time intervals are well known. Generally, the time intervals and the sequences are mechanically fixed such as by switch operated cams driven by a synchronous (clock) motor. Typical examples are clothes washing machines and dishwashers. Some timers such as are frequently found on electric cooking stoves are manually adjustable only as to a one-cycle turn-on and turn-off. Frequently, in the testing of machinery, life cycle testing, transient response testing, and numerous other laboratory tests of devices, it is desirable to be able to control a sequence of events of various intervals. In laboratory testing, it is highly desirable to be able to readily change the sequence and durations of the timed intervals and to provide a cyclic or repetitive operation of the sequence of timed intervals. Typical examples of the prior art may be found in the following patents: U.S. Pat. Nos. 3,713,026 to patentee Kubo; 3,824,480 to patentee Eshraghian; 3,829,784 to patentee Eshraghian; 3,859,543 to patentee Milovancevic; and 3,876,950 to patentee O'Connor.

SUMMARY OF THE INVENTION

The invention provides a manually adjustable programmable timing sequence of a plurality of adjustable timed intervals. The device provides for immediate reprogramming of the time sequence and durations by merely changing switch positions.

BRIEF DESCRIPTION OF THE DRAWING

FIG. 1 is a simplified block schematic diagram of an embodiment of the invention;

FIG. 2 is a time sequence diagram showing a representative programmed time sequence;

FIG. 3 is a schematic representation of a typical switch set;

FIG. 4 is a typical truth table showing the conversion of decimal notation to binary coded decimal notation;

FIG. 5 is a schematic diagram of a typical clock circuit in an embodiment of the invention;

FIG. 6 is a schematic diagram of a typical and/or select gate circuit of an embodiment of the invention; and FIG. 7 is a graph of typical clock waveshapes.

DESCRIPTION OF THE PREFERRED EMBODIMENT

Referring to FIG. 1, the presettable or programmable divide by N counter 1 is programmed by sets of switches or registers 9 through 20. A set of switches (9, 13, 17) or (10, 14, 18) or (11, 15, 19) up to $n$ sets (12, 16, 20) controls the number of clock pulses N required to complete each interval in a sequence $n$ intervals long. Clocks $a$ through $n$ provide independent pulses, therefore, the time base for each interval is independent of all other intervals, even though each may be derived from a common time source. (See FIG. 5.) The and/or select gates 2, 3, 4, and 5, (detailed in FIG. 6), select the proper set of switches or registers and clock signal for each interval. Control of the select inputs on the and/or gates is provided by the 1 of $n$ decoder 7 which is connected to the number of intervals counter 6. The number of intervals ($n$) is determined by the setting of the interval counter, which is controlled by the number of intervals manually placed in select switch 22.

The programmable divide by N counter 1 produces one output pulse after N clock pulses where N is determined by the setting of one of the switch sets 9 through 20. The output pulse is applied to the number of intervals counter 6 and the 1 shot multivibrator 8. The output of the one shot multivibrator is used to reset and/or start the clocks. The output of the controller is taken from the $2°$ output of the interval counter 6 and buffered and inverted by amplifier 21.

The following describes a complete cycle of the programmable controller with the following set of conditions to provide an output as illustrated in FIG. 2.

The number of programmed intervals $n = 4$.

The number of intervals counter 6 is set to 4 by means of manually setting select switch 22.

The arbitrarily desired intervals for example purposes are as illustrated in FIG. 2 with interval one a logical "1" for 32 minutes, interval two a logical "0" for 92 hours, interval three a logical "1" 0.01 second, and interval four a logical "0" for 128 seconds. To set in these intervals the switch sets SS1, SS2, SS3, and SS4 are positioned such that their dials read as follows:

Switch set 1 (switches 9, 13, 17) is set at 032.
Switch set 2 (switches 10, 14, 18) is set at 092.
Switch set 3 (switches 11, 15, 19) is set at 001.
Switch set $n$ (switches 12, 16, 20) is set at 128.

The clock inputs $a$, $b$, $c$ and $d$ to select gate 2 are manually connected (switched) so as to be connected to clock lines M, H, 1/100 S, and S respectively of FIG. 5 which places the inputs as shown in FIG. 7 on these clock lines. The programmable controller will now provide a sequence of (4) intervals as shown in FIG. 2 with interval one being 32 minutes long, interval two 92 hours, interval three 0.01 second, and interval four 128 seconds.

When the interval sequence is first initiated the output of the interval counter 6 is zero, therefore the output of the decoder 7 is a logical "1" on line SG1. All other decoder outputs are at a logical "0". All select SG1 lines are a logical "1". All other select lines are at logical "0". Therefore, only clock $a$ is connected to the input of the programmable divide by N counter 1 and only switch set 1 (switches 9, 13, 17) is connected to the program inputs of the programmable divide by N counter 1.

After 32 clock pulses (N = 32) a single pulse is produced by the programmable divide by N counter 1. This pulse advances the count of the interval counter 6 by one resulting in the output of the decoder 7 changing to a logical "1" on line SG2 and a logical "0" on all other lines. All select SG2 lines are now at a logical "1" and all other select lines are at a logical "0".

Therefore only clock $b$ is connected to the input of the programmable divide by N counter 1 and only switch set 2 (switches 10, 14, 18) is connected to the program inputs of the programmable divide by N counter 1.

After 92 clock pulses (N = 92) a single pulse is produced by the programmable divide by N counter 1. This pulse advances the count of the interval counter 6 by one resulting in the output of the decoder 7 changing to a logical "1" on line SG3 and a logical "0" on all other lines, all select SG3 lines are now at a logical "1" and all other select lines at a logical "0". Therefore, only clock c is connected to the input of the programmable devide by N counter 1 and only switch set 3 (switches 11, 15, 19) is connected to the program inputs of the programmable divide by N counter 1.

After 1 clock pulse (N = 1) a single pulse is produced by the programmable divide by N counter 1. This pulse advances the count of the interval counter 6 by one resulting in the output of the decoder 7 changing to a logical "1" on line SG4 and a logical "0" on all other lines. All select SG4 lines are now at a logical "1" and all other select lines at a logical "0". Therefore, only clock d is connected to the input of the programmable divide by N counter 1 and only switch set 4 (switches 12, 16, 20) is connected to the program inputs of the programmable divide by N counter 1.

After 128 clock pulses (N = 128), a single pulse is produced by the programmable divide by N counter 1. This pulse returns the count of the interval counter 6 to zero resulting in the output of the decoder 7 changing to a logical "1" on line SG1 and a logical "0" on all other lines. All select 1 lines are now at a logical "1" and all other select lines at a logical "0". Therefore, only clock a is connected to the input of the programmable divide by N counter 1 and only switch set 1 (switches 9, 13, 17) is connected to the program inputs of the programmable divide by N counter 1. And so the four-interval sequence repeats.

In a typical embodiment of the invention the device operates in the binary system. Conventional decimal numbers are set in the switch sets 9 through 20. In the embodiment illustrated, all switch sets provide for a decimal setting of three figures, e.g., 318. The switches in the switch set provide a binary coded decimal output of the number set in. Thus, each digit switch provides a binary output indicative of $2°$, a $2^1$, a $2^2$, and a $2^3$. As illustrated in FIG. 3, if the number 8 is set in the switch a logical "1" appears on the $2^3$ line. These are conventional BCD switches. A conventional truth table showing the conversion of the decimal figure to the binary indication is illustrated in FIG. 4.

A typical and/or select gate system for one digit, in BCD notation, is illustrated in FIG. 6. This gate system shown in FIG. 6 is typical of each of the and/or select gates 2, 3, 4, and 5 shown in block form on FIG. 1. The and/or select gate 2 has clock inputs a, b, c, d, n, etc., instead of the BCD inputs from the switches.

Suitable integrated circuit components for the conventional clock circuit illustrated in FIG. 5 are SN7400 guad nand gate 51, and SN7490 for the divide by ten and SN7492 for the divide by six counters. The CD4059AD circuit is a typical circuit suitable for the programmable divide by N counter 1. Suitable circuits for the programmable n counter 6 and the 1 of n decoder 7 are respectively RCA types CD4029 and CD4028. The logical output signal of the device is taken from the $2°$ line from the programmable n counter. The logic signal on this line changes with each time interval change as previously described. Separate independent clocks may be used to provide the cyclic clock time signals instead of dividing down from a single high frequency source.

I claim:

1. An immediately reprogrammable programmable controller for providing a determinable sequence consisting of a determined number of adjustable determined time intervals comprising:
   a. a clock circuit having a continuous running oscillator and resettable dividers providing a plurality of resettable continuous determined time intervals in units and fractions thereof of seconds, minutes and hours;
   b. a plurality of adjustable switches for setting determined decimal time intervals in units of seconds, minutes and hours and providing a binary coded decimal output;
   c. a plurality of and/or select gate circuits cooperating with the said switches;
   d. a number of intervals select switch for setting the said number of time intervals;
   e. means including a programmable divide by N counter cooperating with the said and/or select gate circuits, the said clock, and the said number of intervals select switch to provide a sequential output signal corresponding to the said decimal time intervals set in the said adjustable switches; and
   f. means cooperating with the said programmable divide by N counter for resetting the said resettable dividers of the clock circuit.

2. The apparatus as claimed in claim 1 wherein the said means for resetting the resettable dividers includes a one shot multivibrator.

* * * * *